(12) United States Patent
Bietsch et al.

(10) Patent No.: US 7,168,939 B2
(45) Date of Patent: Jan. 30, 2007

(54) SYSTEM, METHOD, AND APPARATUS FOR MULTILEVEL UV MOLDING LITHOGRAPHY FOR AIR BEARING SURFACE PATTERNING

(75) Inventors: Alexander Bietsch, Rueschlikon (CH); Michael W. Chaw, San Jose, CA (US); Ashok Lahiri, Cupertino, CA (US); Ian Robson McFadyen, San Jose, CA (US); Bruno Michel, Adliswil (CH); Mark C. Thurber, San Jose, CA (US)

(73) Assignee: Hitachi Global Storage Technologies Netherlands BV, Amsterdam (NL)

( * ) Notice: Subject to any disclaimer, the term of this patent is extended or adjusted under 35 U.S.C. 154(b) by 390 days.

(21) Appl. No.: 10/787,476

(22) Filed: Feb. 26, 2004

(65) Prior Publication Data

US 2005/0191418 A1 Sep. 1, 2005

(51) Int. Cl.
*B29C 59/02* (2006.01)
(52) U.S. Cl. ........................... 425/385; 425/406
(58) Field of Classification Search ............... 425/385, 425/406, 174.4; 977/877
See application file for complete search history.

(56) References Cited

U.S. PATENT DOCUMENTS

| | | | |
|---|---|---|---|
| 654,867 A | 7/1900 | Baker | |
| 4,564,585 A | 1/1986 | Blaske et al. | |
| 5,548,886 A | 8/1996 | Kojima et al. | |
| 5,567,333 A | 10/1996 | Hira et al. | |
| 5,768,055 A | 6/1998 | Tian et al. | |
| 5,817,242 A | 10/1998 | Biebuyck et al. | |
| 5,853,959 A | 12/1998 | Brand et al. | |
| 5,895,582 A | 4/1999 | Wilson et al. | |
| 6,004,472 A | 12/1999 | Dorius et al. | |
| 6,061,897 A | 5/2000 | Shouji et al. | |
| 6,088,908 A | 7/2000 | Imamura et al. | |
| 6,309,580 B1 | 10/2001 | Chou | |
| 6,503,406 B1 | 1/2003 | Hsiao et al. | |
| 2002/0008078 A1 | 1/2002 | Hatamura et al. | |
| 2002/0089787 A1 | 7/2002 | Lu et al. | |

FOREIGN PATENT DOCUMENTS

EP 1 072 954 A2 1/2001

(Continued)

OTHER PUBLICATIONS

Bietsch et al, Conformal contact and pattern stability of stamps used for soft lithography, Oct. 1, 2000, Journal of Applied Physics, vol. 88, No. 7, pp. 4310-4318.*

(Continued)

*Primary Examiner*—Joseph S. Del Sole
*Assistant Examiner*—Emmanuel S. Luk
(74) *Attorney, Agent, or Firm*—Bracewell & Giuliani LLP

(57) ABSTRACT

UV molding from elastomeric masters on thin bendable backplanes that allow replication of UV-cured resist patterns with high accuracy is disclosed. This design accommodates large substrate topographies, has improved de-molding properties, and facilitates two-in-one lithography and assembly of the sliders on topographically structured elastomeric sticky pads. The combination of sticky pad assembly and two-in-one lithography allows an all-in-one harmony process based on UV-molding. These features cure prior art technical problems of the harmony process while significantly reducing cost.

16 Claims, 6 Drawing Sheets

FOREIGN PATENT DOCUMENTS

| | | |
|---|---|---|
| JP | 10064213 | 3/1998 |
| JP | 10289424 | 10/1998 |
| JP | 11061447 | 3/1999 |
| JP | 2001006142 | 1/2001 |
| JP | 2001035112 | 2/2001 |

OTHER PUBLICATIONS

Michel et al, Printing meets lithography: Soft approaches to high-resolution patterning, IBM Journal of reseach and development, Advanced Semiconductor Lithography, vol. 45, No. 5, 2001.*

IBM Technical Disclosure Bulletin; *Patterned Substrate for Improved Slider Fabrication*; Oct. 1993, pp. 409-410.

* cited by examiner

SYSTEM, METHOD, AND APPARATUS FOR MULTILEVEL UV MOLDING LITHOGRAPHY FOR AIR BEARING SURFACE PATTERNING

BACKGROUND OF THE INVENTION

1. Technical Field

The present invention relates in general to improved processing of air bearing surfaces and, in particular, to an improved system, method, and apparatus for multilevel UV molding lithography for air bearing surface patterning.

2. Description of the Related Art

Thin film inductive heads and magneto-resistive read heads require for their operation a very small constant effective magnetic spacing between their pole tips and the magnetic medium. This spacing has to be kept constant while the head travels with respect to the rotating disk at a relative speed of several meters per second. Air bearings have been found to be most efficient to guarantee this constant spacing even at variable operation modes caused by the head descending from the headrest or during large external acceleration. An air bearing is a carefully designed airfoil on the disk-facing side of the physical structure carrying both the read and write head. The disk-facing side of this structure (i.e., the slider) must be patterned with high accuracy so that the airfoil meets the required specifications.

The air bearing surface (ABS) includes rails and a cavity between the rails. The ABS is the surface of the slider nearest to the disk. Air is dragged between the rails and the disk surface causing an increase in pressure that tends to force the head away from the disk. Simultaneously, the air rushing past a depression in the ABS produces a lower than ambient pressure area at the depression. This vacuum effect counteracts the pressure produced at the rails. The opposing forces equilibrate so the slider flies over the surface of the disk at a particular fly height. The fly height is the thickness of the air lubrication film or the distance between the disk surface and the transducing head. This film minimizes the friction and resulting wear that would occur if the transducing head and the disk were in mechanical contact during disk rotation.

Typically, the air bearing is formed in the ceramic base material of the slider by two to three lithography steps, followed by either reactive ion etching (RIE) or ion milling (IM). In recent years, the process for industrial manufacturing of sliders has changed considerably and was driven by the shrinking dimensions of the read and write pole tips. To meet such tolerances, the pole tip surface (i.e., the slider lower surface) is lapped until the electrical and magnetic properties are within specification. Currently, lapping is either done on a solid "row" of about 40 to 60 sliders, a pre-parted "row" of about 40 to 60 sliders, or, most recently, on individual sliders. Each of these processes is followed by several photolithography steps to create the ABS on the lapped surface. The narrowing tolerance for the pole tips requires a more accurate lapping process despite the fact that rows of sliders are twisting and bending after being sawed off from the wafer. This problem is solved by partially separating individual sliders into short rows and by distorting the remaining row to allow optimal lapping of all sliders, or by fully separating the rows into individual sliders.

Since photolithography process cost is proportional to the resist coating, alignment, and exposure time, it is highly desirable to devise processes that can create the ABS surface of several sliders in a batch process. The current process, in which approximately 24 rows, each containing approximately 40 to 60 sliders, are mounted on a carrier and subsequently processed, is an air bearing patterning process called "Harmony." The approach of mounting onto the carrier starts by placing rows or sliders with the pole tip facing downwards onto a sticky tape. The carrier is then covered with a UV-curable acrylate and put onto the slider assembly facing downwards. The sliders are fixed to the carrier by a thermal cure or a UV cure and the adhesive tape is peeled off. The lithography and etching process requires the embedding of the rows in a planarization layer, such as a polymer matrix material. For each photo-patterning step, a film resist is transferred to the slider array on the carrier and then exposed sub-row wise by projection lithography. The resist is then developed and the etching process is carried out on the entire slider array. After all processing is finished, the matrix material is removed and the sliders are released through a process called debonding.

In a process known as UV-imprint lithography or UV-molding, a patterned glass master or stamp is pressed into a liquid pre-polymer, which is then cured and solidified using UV light. After release, the pattern fixed in the polymer is an exact replica of the patterned glass surface except that it is difficult to fully displace a polymer on large areas to achieve a pattern with ideal contrast, which means that there is always a residual layer left. Use of an identically patterned elastomeric stamp instead of glass provided a similar replica but with two small differences. First, in the protruding areas of the stamp where the polymer was supposed to be completely displaced down to the supporting surface, thin droplets of polymer (also called "pancakes") were trapped between the stamp and substrate. Second, variation was observed in the thickness of the features molded from the recessed zones of the stamp. Typically, the thicknesses of the features were smaller in the center of the features as compared to their periphery. The depths of these depressions were found to be proportional to the load applied to the stamp, a finding that allowed a mathematical model using equations of elastic theory to define and exactly describe this effect. Calculations for the displacement of the liquids were derived from lubrication theory.

Current hard disk drive technology is continually being pushed to higher levels of areal density and speed concomitant with downward pressures on cost. The ability to efficiently design, evaluate, improve, and subsequently fabricate air bearing sliders and suspensions is deemed critical for success in keeping up with these demands. Currently, patterning of the air bearing surfaces of read-write heads is a multi-step, photo-patterning process with limited yield and chronic reliability problems. Different approaches to the thin film resist technology exist either based on liquid resist, spray on resist, and resist film transfer that can do the required patterning. The difficulty arises from the challenging topography of arrays of slider bars or individual sliders, which require a planarization layer to complete the fabrication.

SUMMARY OF THE INVENTION

UV molding from elastomeric masters on thin bendable backplanes allows replication of UV-cured resist patterns with high accuracy. The strength of this method compared to imprint lithography is its ability to accommodate large substrate topographies and its improved de-molding properties. Successful implementation of this concept requires the formation of a transparent UV-stable conformal stamp. The backplane of the stamps is laminated from a thin glass (approximately 70 microns) and a thin polymer layer (approximately 80 microns) to cope with the slider array co-planarity variation while being sturdy enough to withstand a manufacturing environment. With this configuration, co-planarity variations in step height across a gap of about 300 microns between sliders can be as large as 20 microns, otherwise the sliders can be tilted with respect to the plane of the carrier. To cope with co-planarity variations of about 8 microns, the backplanes of the stamps are formed from a laminate of 30-micron glass and 40-micron polymer, which may be insufficiently stable in a manufacturing environment.

One of the disadvantages of molding from elastomeric masters is their susceptibility to deformation. As the stamp is pushed onto a slider substrate that is coated with viscous pre-polymer, a dome-like deformation is induced in the stamp, which remains as a "pancake" of polymer after the cure. The thickness of the pancakes is dependent on the size of the contact zone. To overcome this difficulty, an initial ash process is used to remove a layer of resist that is thicker than the maximum pancake thickness while not etching the ceramic substrate. For very large zones of polymer displacement, the thickness of the pancakes can become too large to allow their removal while maintaining sufficient resist thickness contrast for subsequent processes. In such a case, grooves can be added to the patterning stamp to facilitate the removal of pre-polymer from these zones. Adding grooves may seem to be detrimental to the patterning function, but calculations show that a balanced network of capillaries can efficiently reduce the maximum thickness of polymer in these zones.

To improve slider array flatness, a bonding pad is provided having flat, elastomeric sticky protrusions separated by grooves or a drainage channel that allows the air or another medium to escape when a flat object is placed on it at high speed. "High speed" means that a pressure of greater than 1 bar can build up in the medium at a gap height of about 0.2 microns or more. The sticky elastomeric protrusions are part of an elastomeric layer that is held on a backplane. The elastomeric layer can be siloxane rubber such as poly(dimethylsiloxane). The material is rubber elastic and relaxes to the original shape after release of mechanical stress.

In addition to the natural stickiness of a flat elastomeric surface, the surface can be enhanced with adhesives or other surface activation. The backplane is a flat, laterally stiff and bendable layer such as thin glass, metal, silicon, or polymer, which holds the elastomeric layer accurately in place to prevent lateral and vertical distortions. The bonding pad accurately holds small parts in place in a coplanar fashion to allow accurate robotic assembly and transfer to another carrier substrate, or to directly allow parallel processing of the parts. Removal of parts from the bonding pad is typically done by gentle peeling since vertical pull will overload either the assembled part or the bonding pad.

The sliders are accurately placed onto a substrate with a robot at vertical speeds of about 10 mm/s, with elastomeric protrusions of about 10 to 20 microns in width that are separated by drainage channels of typically 1–5 micron diameters. The drainage channels prevent air pockets from being trapped below the sliders because the air pressure remains moderate; it only exceeds 1 bar at distances closer than about 150 nm. The deformation of the stamp is low and the amount of trapped air is negligible or small enough to be dissipated quickly through the bonding pad material, because typical elastomeric silicone rubbers are permeable for small amounts of gases. Without the drainage channels, a pressure of greater than 1 bar would build up when a slider approaches the bonding pad closer than 2 microns and an air pocket would be trapped underneath the slider. The air pocket distorts the polymer matrix in a non-predictable way and creates vertical tilt or lateral distortion.

In one embodiment of the present invention, individual sliders are assembled on a sticky elastomeric rubber pad that has been patterned with elongated 5-micron wide and 5-micron deep channels to allow air to escape as the slider body approaches the surface. The assembled sliders are then bonded to a carrier by UV exposure and cure of an acrylate adhesive on the carrier, but a bonding by a thermoplastic material would work as well. After removal of the sticky pad by peeling, the surface of the sliders is covered with a layer of UV-curable material by spray coating, pipetting, or contact with a roller coater.

As in standard imprint-lithography, a patterned stamp is pressed onto the surface to be patterned. The stamp contains a multi-level structure with one lithographic layer having a shallow depth (e.g., 4 microns) and a second lithographic layer having a greater depth (e.g., 4 plus 3 microns). This concept works for designs where the features of the second layer are entirely contained in the boundary of the first layer. Although a two-in-one lithography is contemplated, more levels are conceptually possible given sufficient resist thickness homogeneity, low pancake levels, and a good conservation of resist shapes during subsequent processing. The stamp is pressed onto the sliders and the UV-curable material is solidified under UV exposure, thereby patterning the material as exact replicas of the recessed zones in the stamp.

The subsequent process sequence starts by a removal of the "pancakes" by a selective oxygen ash that only removes 1 micron of polymer but no ceramic (selectivity resist: ceramic >20). The ceramic surface is patterned with the first lithographic layer by ion milling (IM) with an etch selectivity of 2:1 (resist: ceramic). The rest of the thinner polymer layer is removed by the same selective oxygen ash procedure as for pancake removal to expose the second area of the ceramic. The second lithographic layer is then processed by IM to be followed by a final removal of the polymer by oxygen ash. A strong additional advantage of this approach is the inherent alignment among the two or more lithography layers during the replication. The inter-layer alignment depends only on the accuracy given by the master fabrication process.

In one alternate embodiment, the sticky pad contains shallow channels (depth 500 nm, width 2 microns, spacing 20 microns) to allow excess polymer to escape. This structure accelerates the molding process and reduces the pancake size to the level given by the depth of the channels. The sticky pad also is patterned with two lithographic layers as described for the previous embodiment. The UV-curable polymer is spread over the sticky pad by doctor blading to fill all the recessed zones while leaving the top-most surface free from polymer. A tiny additional amount of polymer may be added by spray coating to enable reliable contact between the polymer and the sliders. The robotic manipulator assembles the sliders by assuring the relative alignment of the slider pole tip with the structures of the bonding pad. The coordinates of the patterned bonding pad are measured using either the same upward looking camera needed for slider alignment, or by use of a second downward looking camera. After all sliders are assembled, the carrier is applied to the surface and the dual lithographic pattern as well as the fixation of the sliders to the carrier is complete.

UV soft molding improves the reliability of the air bearing patterning process even on challenging slider array topographies and allows the combination of two photo-patterning steps into one molding step. This is done by a multilevel molding stamp that creates a multilevel polymer structure on the slider array. A transparent, UV-stable conformal stamp carries out the patterning process on challenging slider array geometries with no need for a planarization material to fill the gaps between the sliders in the array.

Use of a patterned poly-dimethylsiloxane (PDMS) sticky pad on a transparent bendable backplane that contains the two-level pattern allows carrying out the patterning step parallel to the assembly of individual sliders. The sticky pad also holds patterns to allow easy displacement of air and polymer to the trenches in between the sliders, thus facilitating a faster process. An advantage of the elastomer sticky pad approach is its ability to provide slider arrays with improved co-planarity.

Three features of the present invention include: (a) two-in-one lithography; (b) assembly of sliders on topographically structured elastomeric sticky pads; and (c) combination of sticky pad assembly and two-in-one lithography allow an all-in-one harmony process based on UV-molding. These features have the potential to radically cure the current technical problems of the air bearing process while allowing a cost reduction by at least a factor of two. The number of simultaneous lithography steps could be larger than two, but only when the reproducibility of resist thickness levels is good enough throughout the process. The implementation of this concept requires a previous carbon deposition step that could be done while still in a lapping fixture or on a temporary additional fixture.

The foregoing and other objects and advantages of the present invention will be apparent to those skilled in the art, in view of the following detailed description of the preferred embodiment of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION OF THE INVENTION

Figure 1:
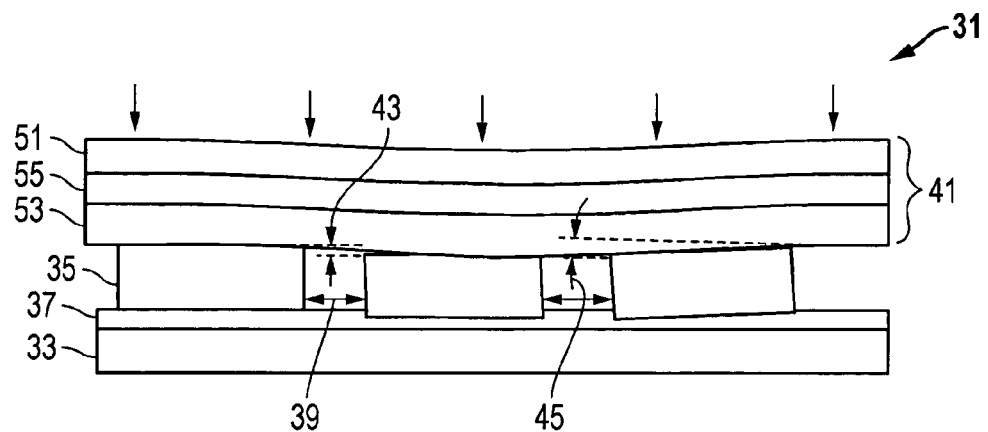
FIG. 1 is a sectional side view of one embodiment of a flexible backplane for accommodating large substrate topographies.

Referring to FIG. 1, one embodiment of a system 31 for replicating resist patterns with high accuracy is shown (not drawn to scale). System 31 is well suited for the processing and UV molding of workpieces, such as sliders in individual slider array processing systems. The system 31 comprises a carrier 33 having a plurality of workpieces 35 mounted thereto with a bonding material 37. Ideally, adjacent ones of the workpieces 35 are spaced apart from each other by a gap 39 of approximately 30 to 300 microns.

The system 31 also utilizes a stamp 41 for accommodating co-planarity variations between the workpieces 35. Variations between the workpieces 35 may include a step height 43 and a tilt angle 45. The step height 43 is defined as the vertical distance between the uppermost surfaces of the workpieces 35. In one version, the maximum value of the step height 43 that can be accommodated by the stamp 41 is approximately 1.2 microns. The tilt angle 45 is defined as the angle at which a workpiece deviates from a desired planar orientation. In one version, the maximum value of the tilt angle 45 that can be accommodated by the stamp 41 is approximately 0.2 degrees. For a stamp having a thinner glass backplane of about 25 microns, the maximal step height can be about 20 microns, and the maximal tilt angle can be about 1 degree for a gap width of 300 microns. Smaller gap widths require improved co-planarities. For example, a gap of 30 microns has a maximal step height of approximately less than 1 micron, and the tilt angle of less than 0.2 degrees for the same stamp having a 25 micron backplane.

The stamp 41 is formed from a laminate of materials comprising, in one embodiment, a polymer layer 51, a pad 53 adjacent to the workpieces 35, and a backplane or glass layer 55 located between the polymer layer 51 and the pad 53. The stamp 41 is a bendable, UV-stable, conformal stamp that is also transparent so that optical equipment may view the workpieces 35 through the stamp 41 for alignment purposes. The pad 53 may be formed as a poly dimethylsiloxane (PDMS) sticky pad. In one embodiment, the pad 53 (which is not drawn to scale) has a thickness in a range of approximately equal to the pattern height to 1000 microns, is preferably about 200 microns thick. The glass layer 55 has a thickness in a range of approximately 25 to 250 microns, and is preferably about 70 microns thick. The polymer layer 51 has a thickness in a range of approximately 25 to 250 microns, and is preferably about 80 microns thick. The pad can be thinned down to the pattern height, which is about 5 microns for a single layer pattern and up to about 15 microns for a multilayer pattern.

Figure 2:
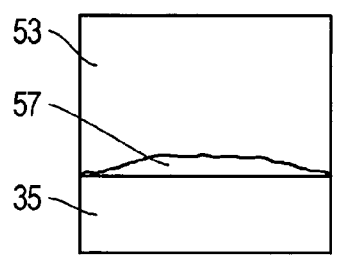
FIG. 2 is a sectional side view illustrating a "pancake" of polymer.
Figure 3:
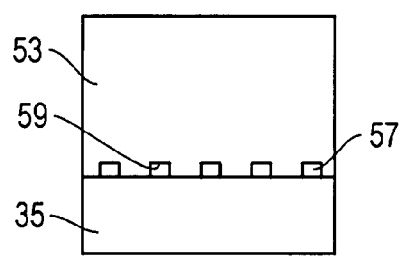
FIG. 3 is a sectional side view of one embodiment of a patterning stamp for reducing polymer pancakes.

Referring now to FIGS. 2 and 3, the workpieces 35 may be coated with a pre-polymer 57. FIG. 2 illustrates a typical "pancake" (described in detail in the background section of this application) that can form between a workpiece 35 and the pad 53. Under such conditions, the system 31 further comprises an initial ash process for removing a layer of resist (the surplus layer of cured pre-polymer) on the workpieces 35. For very large zones of polymer displacement, the pad 53 may further comprise grooves 59 (FIG. 3) formed in the pad 53 to facilitate removal of the pre-polymer 57. In one version, the grooves 59 comprise a series of rectangular notches (e.g., ridges) that are symmetrically spaced apart from each other.

The ridges are designed to have a large fill factor of greater than 50% (upper level vs. trenches), with a preferred version having 20 micron-wide ridges, and 5 micron-wide and 5 micron-deep (i.e., 5 micron-square) trenches between the ridges (e.g., 80% fill factor). Fill factor is maximized to provide a good stickiness. Ridge width can be as small as 1 micron, but not much larger as 100 microns. The trenches can be as wide as 20 microns, but should not be much smaller than 1 micron to perform well. There is a wide range of geometries that can be used (e.g., ridges, square, or round cylindrical dots), but the important fact is that the trenches are elongated or linked with each other such that the air can escape to the side of the contacting sliders.

Figure 4:
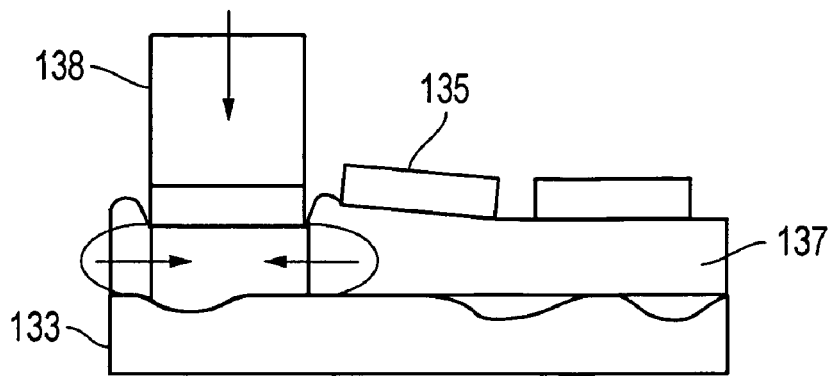
FIG. 4 is a sectional side view of a prior art assembly for processing individual sliders.
Figure 5:
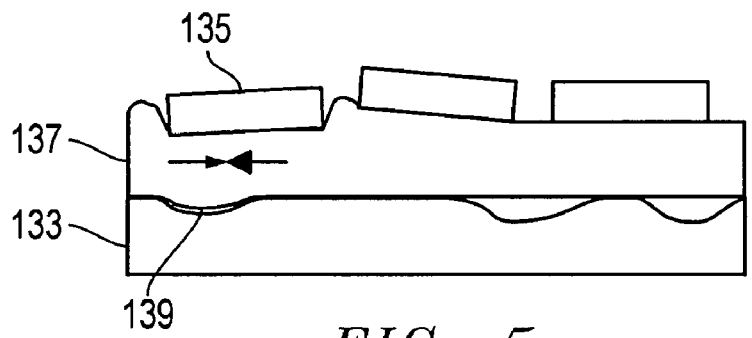
FIG. 5 is a sectional side view of a slider processed by the assembly of FIG. 4.

The majority of the co-planarity variation (see FIGS. 4 and 5) comes from the assembly process of individual sliders. A robot places the sliders 135 on an adhesive tape 137 on the carrier 133 with a pressure of approximately 1 bar. This deforms the adhesive plastically and pushes part of the material into grooves of the vacuum chuck 139.

Figure 6:
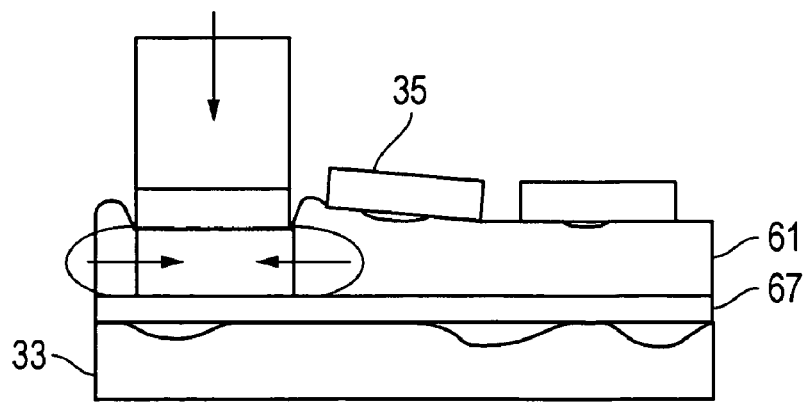
FIG. 6 is a sectional side view of one embodiment of an assembly for processing individual sliders.
Figure 7:
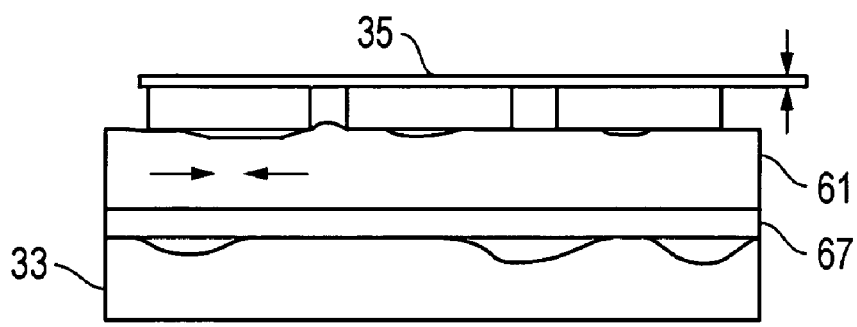
FIG. 7 is a sectional side view of sliders processed by the assembly of FIG. 6.
Figure 8:
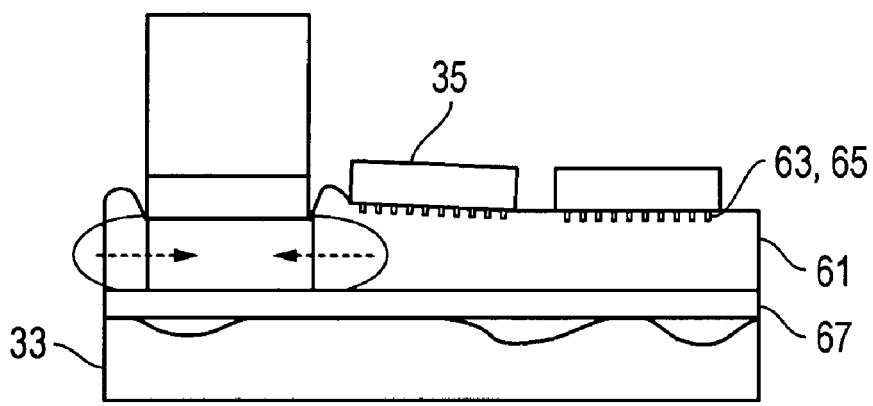
FIG. 8 is a sectional side view of another embodiment of an assembly for processing individual sliders.
Figure 9:
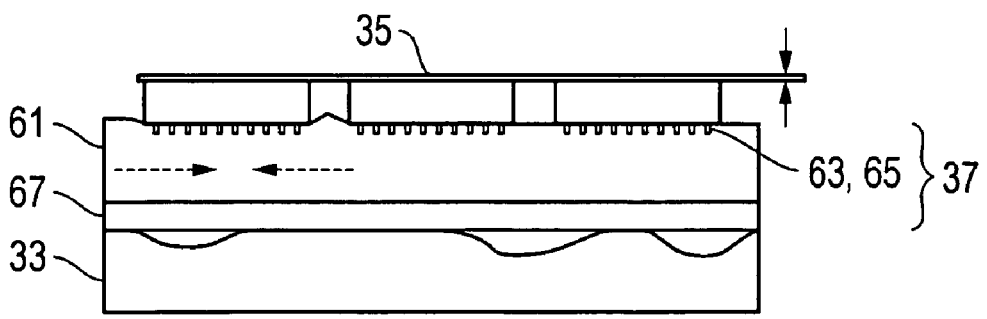
FIG. 9 is a sectional side view of sliders processed by the assembly of FIG. 8.

In order to overcome these problems, the bonding material 37 of the present invention may comprise a bonding pad 61 (FIGS. 6 and 7) having optional sticky, flat elastomeric protrusions 63 (FIGS. 8 and 9) separated by drainage channels 65 that allow the workpieces 35 to be placed thereon at high speed. The workpieces 35 may be placed on the bonding pad 61 at a vertical speed of approximately 10 mm/s. The elastomeric protrusions 63 are approximately 10 to 20 microns in width, and the drainage channels 65 are approximately 1 to 5 microns in diameter. The bonding pad 61 may be formed from a siloxane rubber, such as poly (dimethylsiloxane), and the elastomeric protrusions 63 may be enhanced with a surface activation, such as an adhesive. The bonding material 37 may further comprise a backplane 67 located between the carrier 33 and the bonding pad 61 for preventing lateral and vertical distortions of the bonding pad 61. The backplane 67 is flat, laterally stiff, and bendable, and may be formed from a material such as glass, metal, silicon, or polymer.

Figure 10:
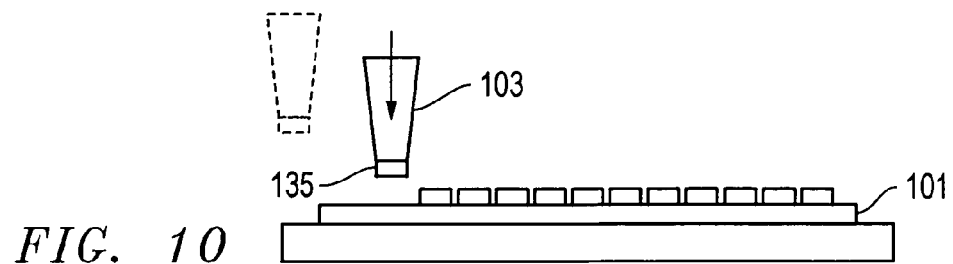
FIG. 10 is a sectional side view of one embodiment of a method for processing individual sliders, illustrating a first step of the sequence.

The present invention also comprises a method of processing workpieces, such as with the system described above. One embodiment of the method, illustrated in FIGS. 10–14, comprises assembling (e.g., such as with a robotic placement device 103) workpieces 135 onto a sticky pad 101 (FIG. 10), such as an elastomeric rubber pad. The sticky pad 101 may be patterned with channels (described above, e.g., as channels 65) for allowing air to escape through the channels as the workpieces 135 are assembled to the sticky pad 101. The channels may be made elongated at approximately 5 microns wide and approximately 5 microns deep.

Figure 11:
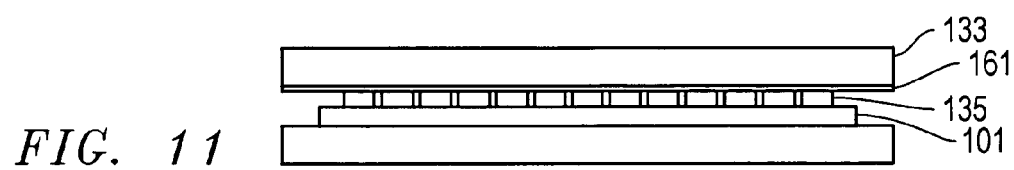
FIG. 11 is a sectional side view of the method of FIG. 10 illustrating one embodiment of a second step of the sequence.
Figure 12:
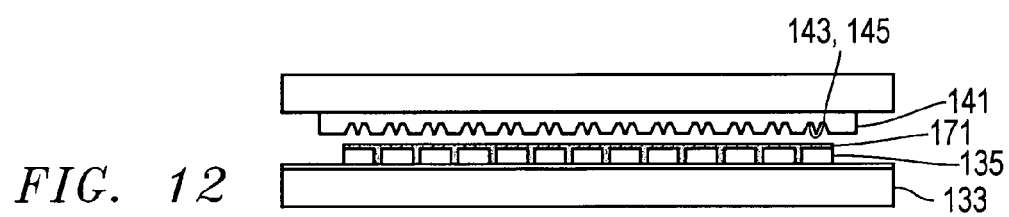
FIG. 12 is a sectional side view of the method of FIG. 10 illustrating one embodiment of a third step of the sequence.
Figure 13:
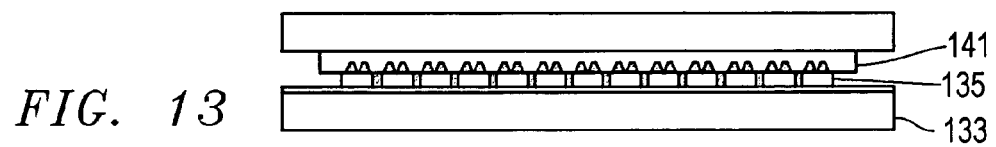
FIG. 13 is a sectional side view of the method of FIG. 10 illustrating one embodiment of a fourth step of the sequence.
Figure 14:
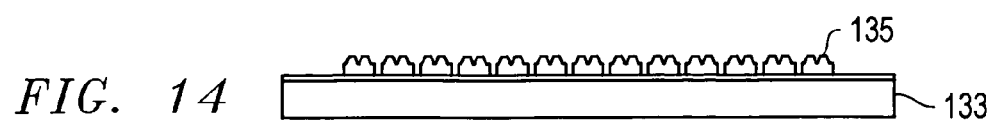
FIG. 14 is a sectional side view of the method of FIG. 10 illustrating one embodiment of a fifth step of the sequence.
Figure 15:
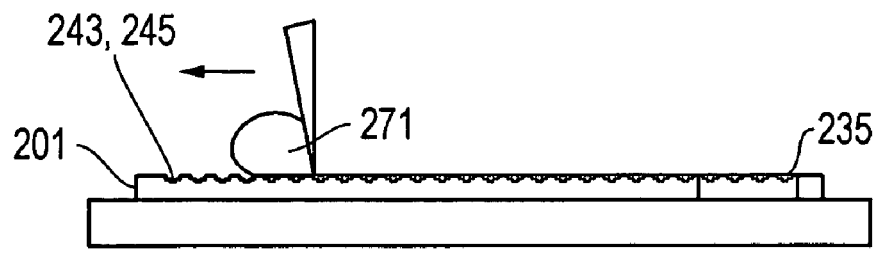
FIG. 15 is a sectional side view of another embodiment of a method for processing individual sliders, illustrating a first step of the sequence.
Figure 16:
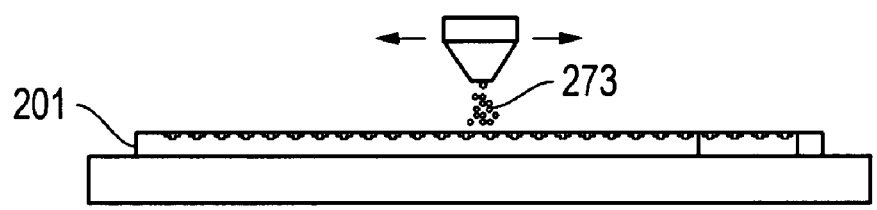
FIG. 16 is a sectional side view of the method of FIG. 15 illustrating one embodiment of a second step of the sequence.

The method further comprises bonding 161 the workpieces 135 to a carrier 133 (FIG. 11), such as by bonding the workpieces 135 to the carrier 133 by UV exposure and cure of an acrylate adhesive on the carrier. Alternatively, the workpieces 135 may be bonded to the carrier 133 with a thermoplastic material. The sticky pad 101 is removed from the workpieces 135, such as by peeling. As shown in FIG. 11, the method comprises applying a layer 171 of UV-curable material to the workpieces 171, such as by spray coating, pipetting, or roller coating.

The method further comprises pressing a patterned stamp 141 (FIG. 13) onto surfaces of the workpieces 135 to form patterns having at least first and second lithographic layers 143, 145, and then UV-curing the patterns on the workpieces 135. Any excess UV-curable material is removed from the workpieces 135, and the first lithographic layer is processed, such as by ion milling. Excess UV-curable material is removed from the first lithographic layer to expose the second lithographic layer, which is then processed, such as by ion milling, before removal of any other excess UV-curable material from the second lithographic layer. The workpieces 135 are then debonded from the carrier 133. Each of the material removal steps may comprise applying a selective oxygen ash that only removes polymer, but not ceramic.

Another embodiment of the present invention is illustrated in FIGS. 15–20. This method of processing workpieces 235 comprises providing a sticky pad 201 (FIG. 15) with patterns having at least first and second lithographic layers 243, 245. The sticky pad 201 may be provided with channels, as described above, that are approximately 2 microns wide, approximately 500 nm deep, and approximately 20 microns apart. A layer of UV-curable material 271 is applied to the sticky pad 201 to fill the patterns. This step may be accomplished by doctor blading the layer onto the sticky pad 201 to fill all recessed zones while leaving a topmost surface free from the layer. In addition, the method may comprise applying, such as by spray coating, an additional amount of UV-curable material 273 (FIG. 16) to the sticky pad to allow reliable contact between the UV-curable material and the workpieces.

Figure 17:
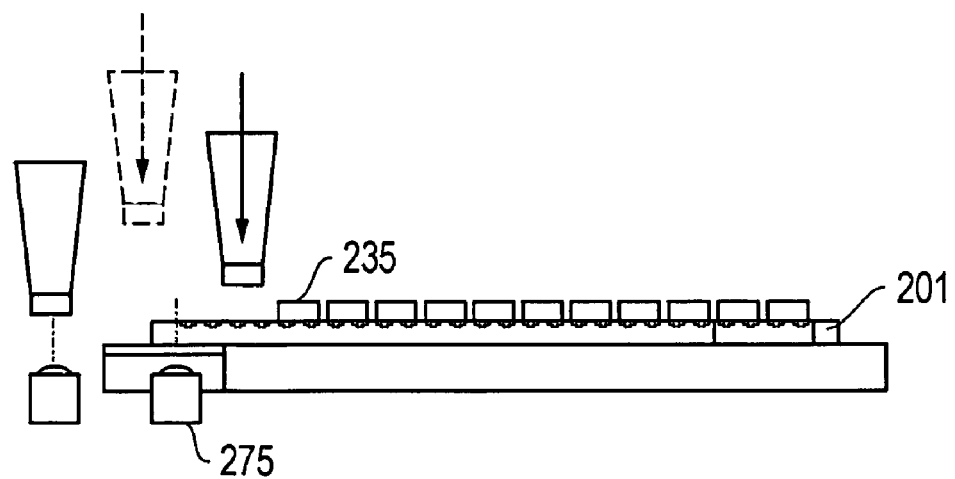
FIG. 17 is a sectional side view of the method of FIG. 15 illustrating one embodiment of a third step of the sequence.
Figure 18:
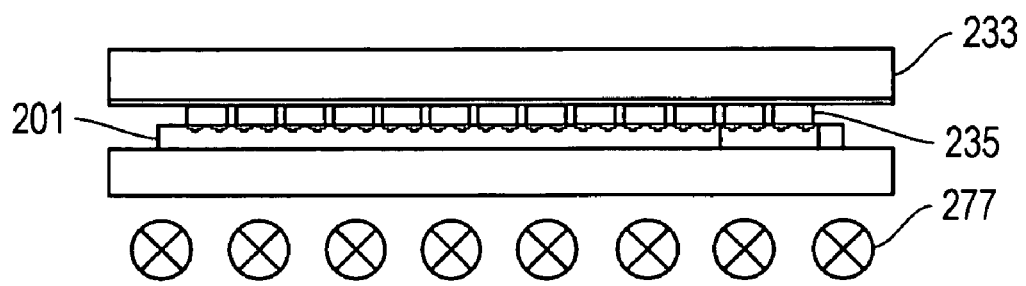
FIG. 18 is a sectional side view of the method of FIG. 15 illustrating one embodiment of a fourth step of the sequence.
Figure 19:
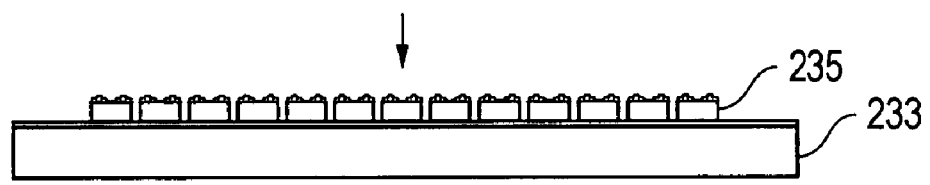
FIG. 19 is a sectional side view of the method of FIG. 15 illustrating one embodiment of a fifth step of the sequence.
Figure 20:
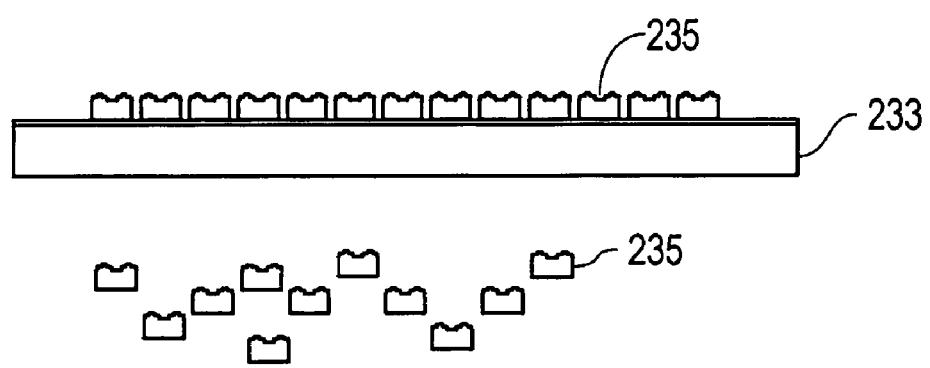
FIG. 20 is a sectional side view of the method of FIG. 15 illustrating one embodiment of a sixth step of the sequence.

The method further comprises assembling the workpieces 235 onto the sticky pad 201 (FIG. 17). This illustration also shows how the workpieces 235 may be viewed through the sticky pad 201 and the layer(s) 271, 273, such as by optical equipment 275. The workpieces 235 are transferred to a carrier 233 (FIG. 18) to expose the UV-curable material 271, which is cured directly on the workpieces 235 (FIG. 19) by UV light source 277. Other processes of removing any excess UV-curable material from the workpieces 235, processing the lithographic layers 243, 245, and debonding (FIG. 20), are carried out as described above for the preceding embodiment.

Three features of the present invention include: (a) two-in-one lithography; (b) assembly of sliders on topographically structured elastomeric sticky pads; and (c) combination of sticky pad assembly and two-in-one lithography allow an all-in-one harmony process based on UV-molding. These features have the potential to radically cure the current technical problems of the harmony process while allowing a cost reduction by at least a factor of two. The number of simultaneous lithography steps could be larger than two, but only when the reproducibility of resist thickness levels is good enough throughout the process. The implementation of this concept requires a previous carbon deposition step that could be done while still in a lapping fixture or on a temporary additional fixture.

The present invention has many other advantages, including the ability to do UV molding from elastomeric masters on thin bendable backplanes to allow replication of UV-cured resist patterns with high accuracy. The strength of this method compared to imprint lithography is its ability to accommodate large substrate topographies and its improved de-molding properties. To improve slider array flatness, a bonding pad is provided having flat, elastomeric sticky protrusions separated by grooves or a drainage channel that allows the air or another medium to escape when a flat object is placed on it at high speed. In addition to the natural stickiness of a flat elastomeric surface, the surface can be enhanced with adhesives or other surface activation.

The backplane holds the elastomeric layer accurately in place to prevent lateral and vertical distortions. The bonding pad accurately holds small parts in place in a coplanar fashion to allow accurate robotic assembly and transfer to another carrier substrate, or to directly allow parallel processing of the parts. The sliders are accurately placed onto a substrate having protrusions that are separated by drainage channels. The drainage channels prevent air pockets from being trapped below the sliders because the air pressure remains moderate. The deformation of the stamp is low and the amount of trapped air is negligible enough to be dissipated quickly through the bonding pad material. Although a two-in-one lithography is contemplated, more levels are conceptually possible given a good resist thickness homogeneity, low pancake levels, and a good conservation of resist shapes during subsequent processing. A strong additional advantage of this approach is the inherent alignment among the two or more lithography layers during the replication.

While the invention has been shown or described in only some of its forms, it should be apparent to those skilled in the art that it is not so limited, but is susceptible to various changes without departing from the scope of the invention.

What is claimed is:

1. A system for replicating resist patterns with high accuracy, comprising:
   a carrier having a plurality of workpieces mounted thereto with a bonding material, the bonding material comprising a bonding pad having flat elastomeric sticky protrusions separated by drainage channels that allow the workpieces to be placed thereon at high speed; and
   a stamp for accommodating co-planarity variations between the workpieces including a step height and a tilt angle, the stamp being formed from a laminate of materials comprising a polymer layer, a pad adjacent to the workpieces, and a glass layer located between the polymer layer and the pad.

2. The system of claim 1, wherein the stamp is a transparent, bendable, UV-stable, conformal stamp.

3. The system of claim 1, wherein the pad is a poly-dimethylsiloxane sticky pad.

4. The system of claim 1, wherein the glass layer has a thickness in a range of approximately 25 to 250 microns.

5. The system of claim 1, wherein the polymer layer has a thickness in a range of approximately 25 to 250 microns.

6. The system of claim 1, wherein the pad has a thickness in a range of approximately 5 to 1000 microns.

7. The system of claim 1, wherein adjacent ones of the workpieces are spaced apart from each other by approximately 30 to 1000 microns.

8. The system of claim 1, wherein a maximum value of the step height that can be accommodated by the stamp is up to approximately 20 microns.

9. The system of claim 1, wherein a maximum value of the tilt angle that can be accommodated by the stamp is up to approximately 2 degrees.

10. The system of claim 1, wherein the workpieces are coated with a pre-polymer.

11. The system of claim 10, further comprising grooves formed in the pad to facilitate removal of the pre-polymer.

12. The system of claim 11, wherein the grooves comprise a series of rectangular ridges that are symmetrically spaced apart from each other.

13. The system of claim 1, wherein the elastomeric protrusions are approximately 20 microns in width, and the drainage channels are approximately 5 microns in width and depth.

14. The system of claim 1, wherein the bonding pad is formed from a siloxane rubber, such as poly-dimethylsiloxane.

15. The system of claim 1, wherein the flat elastomeric sticky protrusions are enhanced with a surface activation.

16. The system of claim 1, wherein the bonding material further comprises a backplane located between the carrier and the bonding pad for preventing lateral and vertical distortions of the bonding pad, and the backplane is flat, laterally stiff, and bendable, and is formed from a material selected from the group consisting of glass, metal, silicon, and polymer.

* * * * *